United States Patent [19]

Hara et al.

[11] Patent Number: 5,326,981
[45] Date of Patent: Jul. 5, 1994

[54] ELECTRON BEAM EXCITED ION IRRADIATION APPARATUS

[75] Inventors: Tamio Hara, Tokyo; Manabu Hamagaki, Higashi-Matsuyama; Katsunobu Aoyagi, Tsurugashima; Takeshi Yamada, Kobe; Makoto Ryoji, Tokyo; Masakuni Tokai, Inami; Yosuke Kajiyama, Kobe, all of Japan

[73] Assignees: Kawasaki Jukogyo Kabushiki Kaisha, Hyogo; Riken Institute of Physical and Chemical Research, Saitama, Japan

[21] Appl. No.: 950,661

[22] Filed: Sep. 25, 1992

[30] Foreign Application Priority Data

Sep. 27, 1991 [JP] Japan .................. 3-274960

[51] Int. Cl.⁵ .............................. H01J 37/30
[52] U.S. Cl. ..................... 250/492.21; 250/427; 315/111.81
[58] Field of Search ............ 250/492.21, 427; 315/111.81

[56] References Cited

U.S. PATENT DOCUMENTS

| | | | |
|---|---|---|---|
| 4,559,477 | 12/1985 | Leung et al. | 250/427 |
| 4,749,910 | 6/1988 | Hara et al. | 315/111.81 |
| 4,749,912 | 6/1988 | Hara et al. | 250/427 |
| 4,782,235 | 11/1988 | Lejeune et al. | 250/423 |
| 5,028,791 | 7/1991 | Koshiishi et al. | 250/427 |
| 5,072,125 | 12/1991 | Nakanishi et al. | 250/492.21 |

FOREIGN PATENT DOCUMENTS 61-290629 12/1986 Japan .

Primary Examiner—Bruce C. Anderson
Attorney, Agent, or Firm—Oliff & Berridge

[57] ABSTRACT

In an electron beam excited ion irradiation apparatus which irradiates ions to a material, an electrical discharge changes an inert gas into a plasma. Electrons are drawn from this plasma and are made into electron beams. The electron beams are passed through an active gas to create ion. When the ion is irradiated to a material, electron components of the electron beams, which are irradiated vertically to a surface of the material are changed their irradiation direction. Control of the range of electron beam irradiation is performed by a magnetic filed formed so as to surround the ion beams.

15 Claims, 9 Drawing Sheets

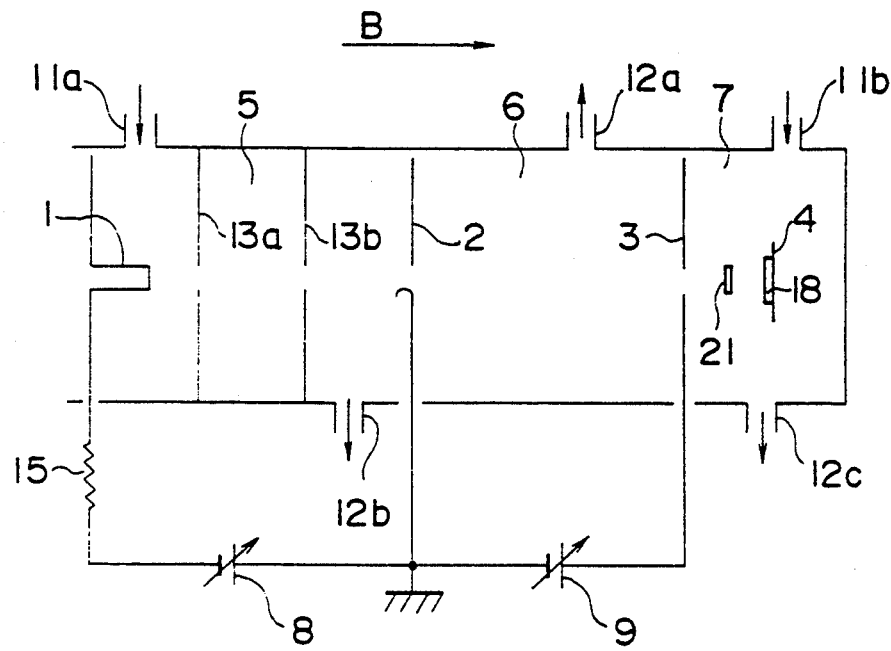
F I G. 1
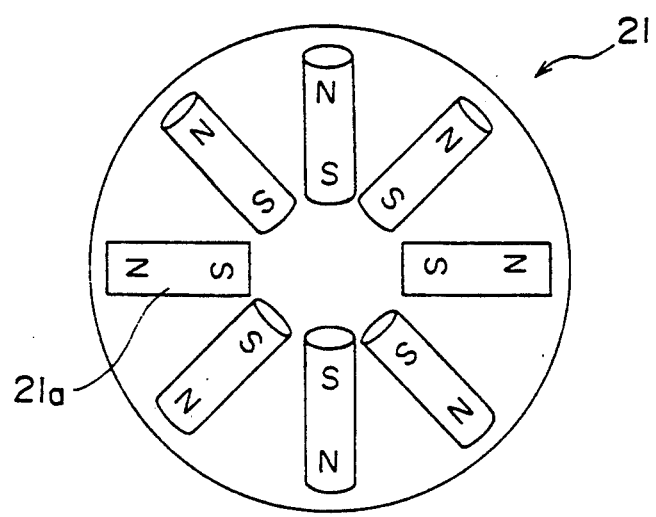
F I G. 2

ELECTRON BEAM EXCITED ION IRRADIATION APPARATUS

BACKGROUND OF THE INVENTION

The present invention relates to an electron beam excited plasma apparatus which irradiates a material with ions generated by an electron beam.

As disclosed in Japanese Patent Laid-Open Application No. 290629-1986, ion irradiation apparatus are used for performing dry etching to integrated circuits such as IC and LSI and the like. Currently known ion irradiation apparatus are systems which generate a plasma by a DC (direct current) discharge, RF (high frequency) discharge, ECR (electron cyclotron resonance) or an electron beam or the like, use the action of an electric field to draw only ions from the plasma, and which irradiate these ions to a material. When ions are irradiated to a material such as an 8-inch Si wafer which has a large diameter and dry etching is performed with respect to the Si wafer, large marks or other damage must not be caused to the Si wafer. This requires satisfying the mutually opposing conditions of uniformly irradiating an ion irradiation having a large current density across a large sectional surface and in a low energy ion region.

However, with a conventional ion irradiation apparatus, increasing the ion current density in the low energy ion region means that it is not possible to have uniformity for a large sectional area.

In order to solve the problem of these mutually opposing conditions, there has been the development of an electron beam excited plasma technology which enables the generation of a high-density plasma which produces a large ion current density. When a material is held at a floating potential, the influence of the large electron beam component causes the ion energy to become higher in the vicinity of the axis of the electron beam at the center of the material, and furthermore, it is not possible to have a uniform ion current density.

SUMMARY OF THE INVENTION

An object of the present invention is to provide an electron beam excitated plasma apparatus which generates an ion having a uniform and large current density for across a large sectional area, and which performs dry etching without damage to a material even when that ion is irradiated at a low ion energy region to a material such as an Si wafer or the like.

According to the present invention, an electron beam excited plasma apparatus for making an inert gas into a plasma by an electrical discharge, applying electrons which are included in the plasma to an active gas to generate ions and irradiating the ions to a material, comprises a plasma filling chamber provided with a cathode and a first acceleration electrode becoming an anode electrically when given a first specific potential difference with respect to the cathode, the discharge created by the first potential difference making the inert gas introduced in the plasma filling chamber into a plasma, an electron beam acceleration chamber provided with a second acceleration electrode becoming an anode electrically with respect to the first acceleration electrode, when given a second specific potential difference with respect to the first electrode, the electrons being drawn from the filled plasma by the second potential difference and forming and accelerating electron beams, and an ion generation chamber provided with a material setting member arranged so that the material opposes the second acceleration electrode, ion being generated, by the second acceleration electrode, when the accelerated electron beam are made to pass through the active gas introduced in the ion generation chamber, the ion being irradiated to the material, the ion generation chamber further provided with electron movement direction changing means, allocated between the material and the second acceleration electrode, for changing a direction of the electron beams, in order to prevent the material from being injected by the electron beams.

Furthermore, according to the present invention, a method of electron beam excited ion irradiation comprises the steps of generating a discharge in an atmosphere of an inert gas and making the inert gas into a plasma, applying a specific potential difference to electrons which are included in the plasma, to draw the electrons out, make the electrons into electron beams and accelerate the electron beams, passing the electron beams through an active gas to generate ions, irradiating the ion to a material, and changing a direction of positioning of the material to electron beam by tilting the angle of the material setting member.

Furthermore, according to the present invention, an electron beam excited ion irradiation apparatus for making an inert gas into a plasma by an electrical discharge, applying electrons which are included in the plasma to an active gas to generate ions, and irradiating the ions to a material, comprises a plasma filling chamber provided with a cathode and a first acceleration electrode becoming an anode electrically when given a first specific potential difference with respect to the cathode, the discharge created by the first potential difference making the inert gas introduced in the plasma filling chamber into a plasma, an electron beam acceleration chamber provided with a second acceleration electrode becoming an anode electrically with respect to the first acceleration electrode when given a second specific potential difference with respect to the first acceleration electrode, electrons being drawn from the filled plasma by the second potential difference and forming and accelerating electron beams, an ion generation chamber provided with a material setting member arranged so that the material opposes the second acceleration electrode, when the accelerated electron beams are made to pass through the active gas introduced in the ion generation chamber, the ion being irradiated to the material, the ion generation chamber further provided with a plural number of magnets arranged so as to surround the ion and electrons, a magnetic field formed by the magnets holding the ion and electrons inside the ion generation chamber.

BRIEF DESCRIPTION OF THE DRAWINGS

FIG. 1 is an outline side view of a first embodiment of an electron beam excited ion irradiation apparatus of the present invention;

FIG. 2 is an outline sectional view of another example of a magnetic shutter used in the electron beam excited ion irradiation apparatus of FIG. 1;

DETAILED DESCRIPTION OF THE PREFERRED EMBODIMENTS

Figure 3:
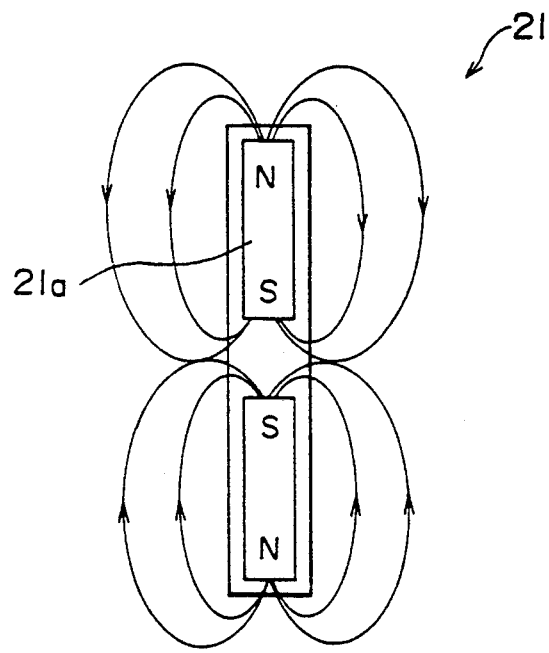
FIG. 3 is an outline view showing the generation of the magnetic flux in the magnetic shutter shown in FIG. 2.

FIG. 1 shows a first embodiment of an electron beam excited ion irradiation apparatus of the present invention. As shown in FIG. 1, inside the ion irradiation apparatus are arranged a cathode 1, an acceleration cathode 2 which also acts as an anode, an acceleration anode 3 and a material setting member 4.

Between the cathode 1 and the acceleration cathode 2 a plasma filling chamber 5 is provided which is filled with plasma, and between the acceleration cathode 2 and acceleration anode 3 an electron beam acceleration chamber 6 is provided which accelerates electrons drawn from the plasma filling chamber 5. There is further formed an ion generation chamber 7 which houses the material setting member 4.

Between the cathode 1 and the acceleration cathode 2 is connected a discharge power source 8 via a resistor 15 and across both is applied a potential difference of from 30 V to 70 V, and desirably 50 V to generate a plasma generation discharge in this plasma filling chamber 5 as described later.

Between the acceleration cathode 2 and the acceleration anode 3 is connected an acceleration power source 9 and across the two is applied a potential difference of from 50 V to 150 V, or desirably 100 V. This potential difference is applied and as described later, draws electrons from the plasma generated inside the plasma filling chamber 5 and ions generated inside the ion generation chamber 7 are drawn to the acceleration cathode 2.

The acceleration cathode 2 is directly grounded. The material setting member 4 is in an electrical state of floating potential or grounded via a voltage variable alternating current power source for ion energy control and which is not shown in the figure, and controls the potential of the material setting member 4 with respect to the acceleration anode 3. A material 18 set on the material setting member 4 is in an electrical state of floating potential or grounded via the voltage variable alternating current power source.

A magnetic shutter 21 used to generate a magnetic field inside the ion generation chamber 7, is arranged between the material setting member 4 and the acceleration anode 3.

A gas introduction opening 11a is provided to the plasma filling chamber 5 and a gas introduction opening 11b is provided to the ion generation chamber 7.

A gas exhaust opening 12a is provided to the electron beam acceleration chamber 6 and a gas exhaust opening 12b is provided to the plasma filling chamber 5 and gas exhaust opening 12c is provided to the ion generation chamber 7.

An inert gas such as argon gas and the active gas are made to flow from the gas introduction openings 11a and 11b into the apparatus and control of the amount of this gas flow is performed to apply a gas pressure to the plasma filling chamber 5 of from $1 \times 10^{-1}$ Torr to $1 \times 10^{-4}$ Torr or desirably, of $5 \times 10^{-2}$ Torr, a gas pressure to the electron beam acceleration chamber 6 of from $5 \times 10^{-5}$ Torr to $2 \times 10^{-4}$ Torr or desirably, of $1 \times 10^{-4}$ Torr, and a gas pressure to the ion generation chamber 7 of from $2 \times 10^{-4}$ Torr to 1 Torr or desirably, of $1 \times 10^{-3}$ Torr. Then, the gas which is allowed flow to into the apparatus is discharged from the exhaust openings 12a, 12b and 12c.

The plasma filling chamber 5 is provided with partitions 13a and 13b and the gas which flows into apparatus from the gas introduction opening 11a is given a pressure difference by this partition. In this embodiment, the partition 13a has an internal diameter of 6 mm $\phi$ and a length of 20 mm, while the partition 13b has an internal diameter of 8 mm $\phi$ and a length of 20 mm.

When a potential difference is applied across the cathode 1 and the acceleration cathode 2, a discharge occurs across the two and this discharge generates a plasma inside the plasma filling chamber 5.

The electrons which form the plasma are drawn to the acceleration anode 3 and enter the ion generation chamber 7 to generate ions. One portion of the generated ions which enter into the electron beam acceleration chamber 6 lower the negative potential barrier formed in the vicinity of the opening of the acceleration cathode 2 and limit the amount of negatively charged cavity charge.

Accordingly, an electron flow of a quantity proportional to the plasma density inside the plasma filling chamber 5 flows into the ion generation chamber 7 and in this ion generation chamber 7 there are generated ions in an amount proportional to the amount of electrons which have flown in.

The generated ions have their energy controlled by the potential of the material setting member 4 and are irradiated to the material 18 on the material setting member 4.

A magnetic field is created by electromagnets or permanent magnets not shown in the figure in the direction of progress of the electrons and ions as shown by the arrow B between the cathode 1 and the acceleration anode 3 to prevent the widening of the electron flow and the ion flow in the lateral direction.

The electron beam progresses with a widening diameter but the presence of the magnetic field due to the magnetic shutter 21 changes the direction of progress of the electron beam. As a result, the electron components which have a large energy of motion in the vertical direction to the material 18 and hit the material 18 are controlled to decrease the floating potential and prevent damage with respect to the material 18.

As shown in FIG. 2, internal to the magnetic shutter 21 is a magnetism generation mechanism 21a such as permanent magnets, electromagnets or the like, and arranged in a ring shape. This magnetism generation mechanism 21a generates magnetic flux so as to envelop the magnetic shutter 21.

In FIG. 2, permanent magnets are used for a magnetism generation mechanism 21a which configures the magnetic shutter 21. FIG. 3 shows the generation of the magnetic flux in the magnetic shutter 21a of FIG. 2.

Figure 4:
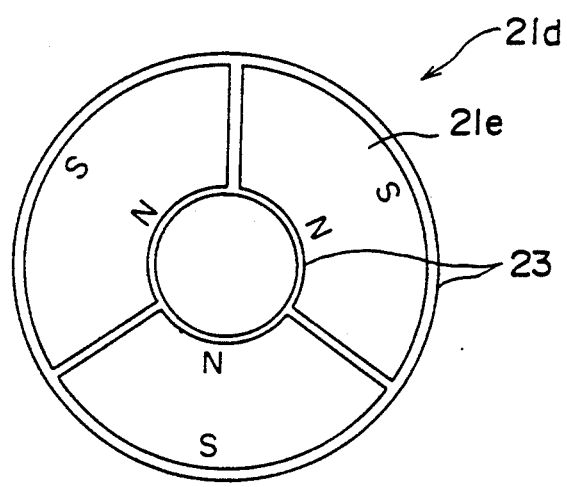
FIG. 4 is an outline sectional view of still another example of a magnetic shutter used in the electron beam excited ion irradiation apparatus of FIG. 1.

FIG. 4 shows another example of a magnetic shutter, wherein a magnetic shutter 21d is configured from housing a fan-shaped permanent magnet 21e inside a holder 23.

Figure 5:
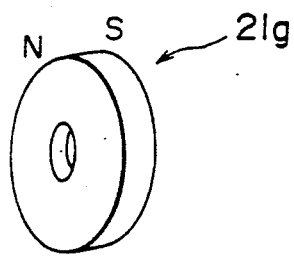
FIG. 5 is an outline sectional view of a further example of a magnetic shutter used in the electron beam excited ion irradiation apparatus of FIG. 1.

FIG. 5 shows a further example of a magnetic shutter in which a ring-shaped permanent magnet is used as it is, as a magnetic shutter 21g.

Figure 6:
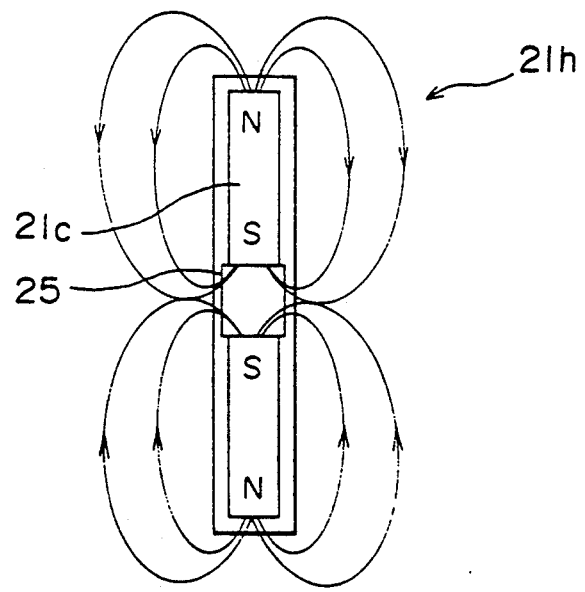
FIG. 6 is an outline sectional view of a still further example of a magnetic shutter used in the electron beam excited ion irradiation apparatus of FIG. 1.

The magnetic shutter 21 controls the electron components which hit the material 18 in the vertical direction and with a large energy of motion. In order for the effect of control to be further strengthened, as shown in FIG. 6, there is provided a charged particle passage prevention means 25 such as silicon wafer or the like in a through hole in the center of the magnetism generation mechanism 21c which configures a magnetic shutter 21h. This charge particle passage prevention means 25 controls the charged particles which have a large energy and which hit the material 18 in the vertical direction.

This charge particle passage prevention means 25 can be applied to the magnetic shutter used in FIGS. 2, 4 and 5.

Figure 7:
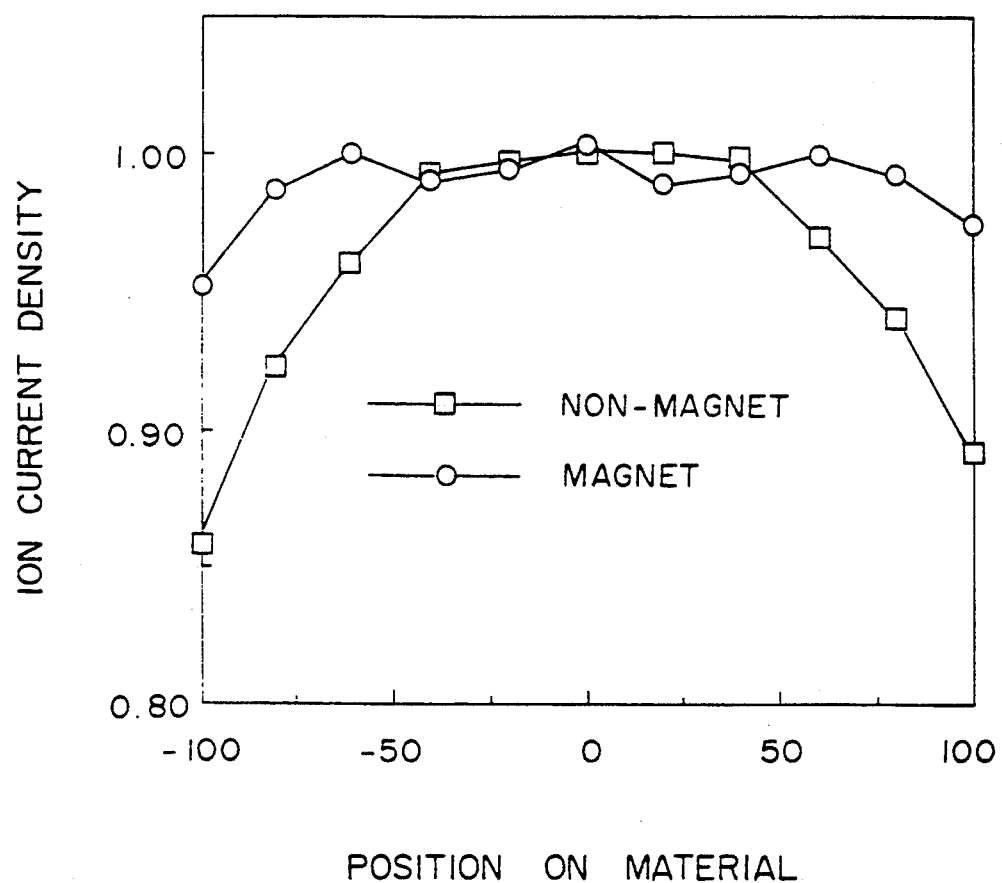
FIG. 7 is a characteristics diagram for ion current distribution when the magnetic shutter of the present invention is used.

FIG. 7 shows the uniformity of the ion current density due to the action of the magnetic shutter 21 when chlorine gas flows into the ion generation chamber 7 via the gas introduction opening 11b.

In FIG. 7, the horizontal axis shows the position on the material 18 as the distance from the center of the material 18, while the vertical axis shows the ion current density. When compared to the case when the magnetic shutter 21 is not used, the case when the magnetic shutter 21 is used has an improved uniformity of ion current density which is improved from ±7% to ±2.5% within ±100 mm.

In the ion generation chamber 7, the magnetic flux lines in the direction of the axis successively widen in the lateral direction and the electron beams widen along with this.

Figure 8:
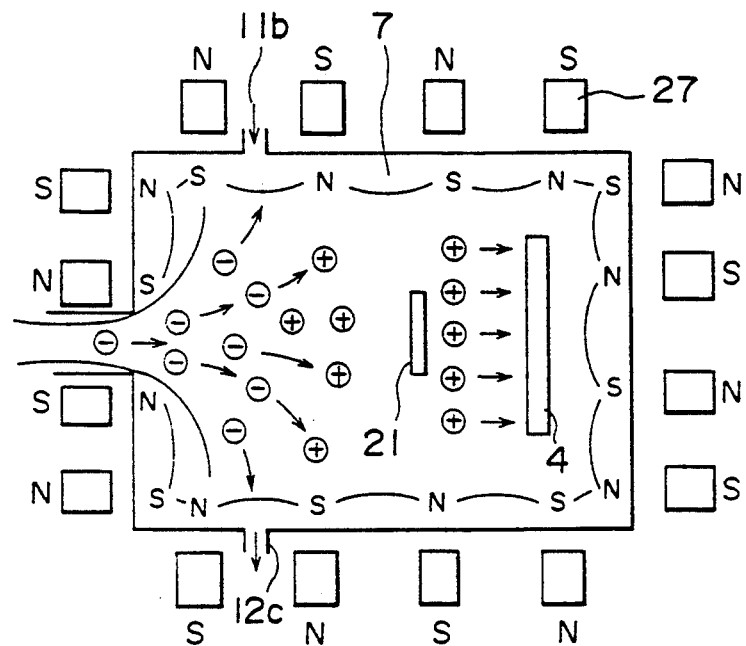
FIG. 8 is an outline side view of another embodiment of an electron beam excited ion irradiation apparatus of the present invention.

In the embodiment shown in FIG. 8, the region of the outer periphery of the ion generation chamber 7 has arranged a plural number of permanent magnets 27. The electron beams which have had their direction of motion changed by the magnetic shutter are also reflected along with the magnetic field which widen in the direction of the diameter and exceed the range of influence of the magnetic shutter, towards the inside because of the magnetic field of the permanent magnets 27 arranged around the rear (the side of the material) of the magnetic shutter. Because of this, there is a decrease in the plasma density in the vicinity of the front of the material and at the same time, there is also an increase in the plasma density in the vicinity of the periphery of the material. Accordingly, for large diameters, it is possible to have the irradiation of ion beams having a favorable uniformity and a large current density in a large diameter.

In FIG. 8, an non-magnetic shutter can be used instead of the magnetic shutter 21. The electron beams also enter the non-magnetic shutter but electron beams which have a widening in the direction of their diameter and which are larger than the diameter of the non-magnetic shutter are reflected to the inside by the magnetic field caused by the permanent magnets 27, and becomes ion having a large current density and favorable uniformity for large diameters in the vicinity of the surface of the material 18.

Figure 9:
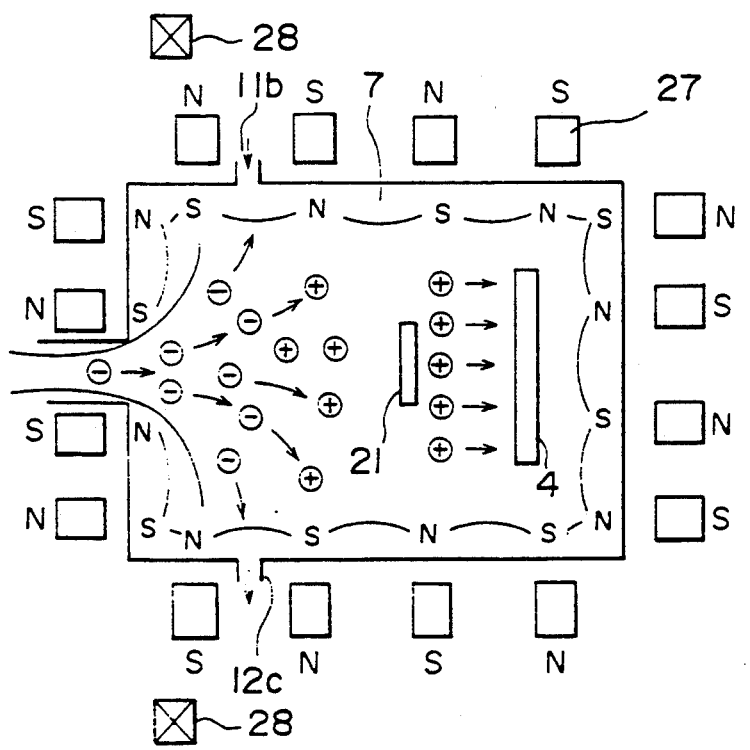
FIG. 9 is an outline side view of a further embodiment of an electron beam excited ion irradiation apparatus of the present invention.

In the embodiment shown in FIG. 9, there is also provided a coil 28 for impressing an inverted magnetic field to the region of the periphery of the ion generation chamber 7. This coil 28 impresses a magnetic field in the direction opposite that shown by the arrow B in FIG. 1. Accordingly, in the ion generation chamber 7, the magnetic field in the direction of the axis weakens and the lines of magnetic flux in the direction of the axis widen in the lateral direction and so the electron beams widen accordingly.

The coil 28 widens the electron beams suddenly and over a short distance as well as realizes a large space having a non-magnetic field on the inside of the multipole magnetic field caused by the plural number of permanent magnets 27. Accordingly, the electron beams which have been dispersed by the magnetic shutter 21 and had their direction changed, are also reflected once more to the inside by the multi-pole magnetic field. As a result, it is possible for an electron beams and the plasma to be easily dispersed in the space where there is no magnetic field, and for ion irradiation of high uniformity to be possible for a large area and at low energy.

Figure 10:
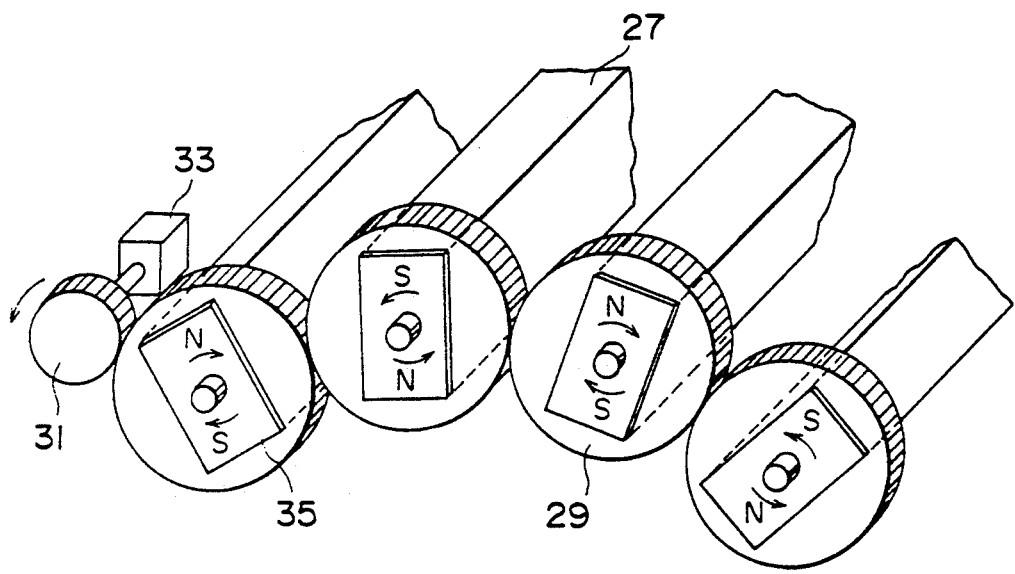
FIG. 10 is an outline perspective view showing the magnet rotation mechanism used in the electron beam excited ion irradiation apparatus of present invention.

In the embodiment shown in FIG. 10, the plural number of permanent magnets 27 provided around the outer peripheral wall of the ion generation chamber 7 can freely rotate. When the permanent magnets 27 rotate, the shape and the intensity of the generated multi-pole magnetic field change so that it is possible to control the plasma and the ion which are generated inside the ion generation chamber 7.

In FIG. 10, to one of the end portions of each of the permanent magnets 27 is provided a transmission gear 29. The plural number of transmission gears 29 engage and a drive gear 31 engages with one of the transmission gears 29 and each of the transmission gears 29 rotate in the direction shown by the arrow when the drive gear 31 rotates because of a drive means 33.

Figure 11:
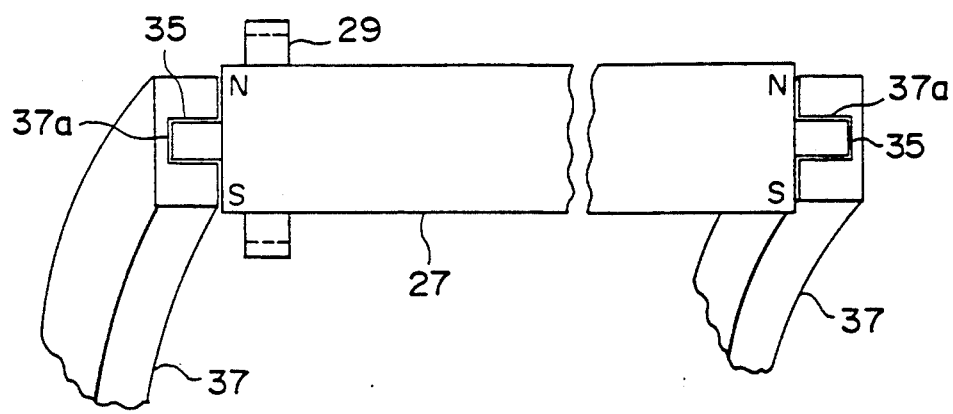
FIG. 11 is an outline side view showing the magnet rotation mechanism shown in FIG. 10.

FIG. 11 is an outline side view showing the magnet rotation mechanism shown in FIG. 10. To both of the end portions of each of the permanent magnets 27 are provided rotating shafts 35. A support frame 37 is provided to both of the end portions of the outer peripheral wall of the ion generation chamber 7 and this has a hole portion 37a formed in it. The insertion of the rotating shaft 35 into this hole portion 37a supports the permanent magnets 27 in the support frame 37. In FIGS. 10 and 11, the ion generation chamber 7 is not shown.

Figure 12:
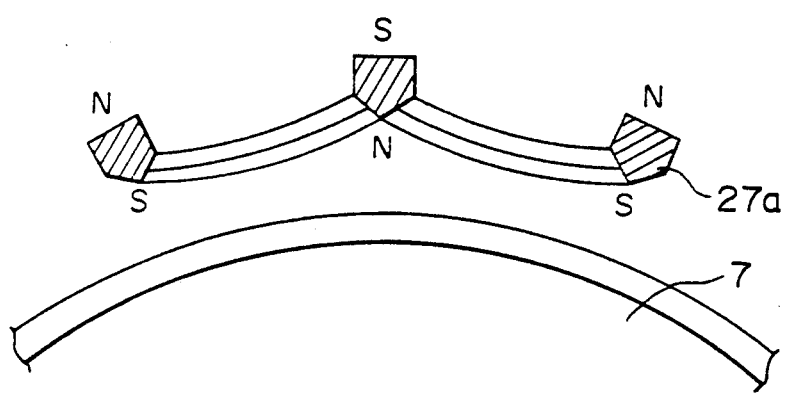
FIG. 12 is an outline sectional view showing one example of the plural number of magnets provided to the outer peripheral wall of the ion generation chamber of the present invention.

In the embodiment shown in FIG. 12, the sectional surface of the side of the outer peripheral wall of the plural number of permanent magnets 27a provided around the outer peripheral wall of the ion generation chamber 7 is triangular. Having this triangular enables the magnetic field of the permanent magnets 27a to be limited to the outer peripheral portion of the ion generation chamber 7 and furthermore, enables the generation of the plasma having a uniform distribution over a large diameter to be generated in the peripheral portion of the material 18 inside the ion generation chamber 7.

Furthermore in FIG. 12, the permanent magnets 27a can be provided around the inner peripheral wall of the ion generation chamber 7.

Figure 13A:
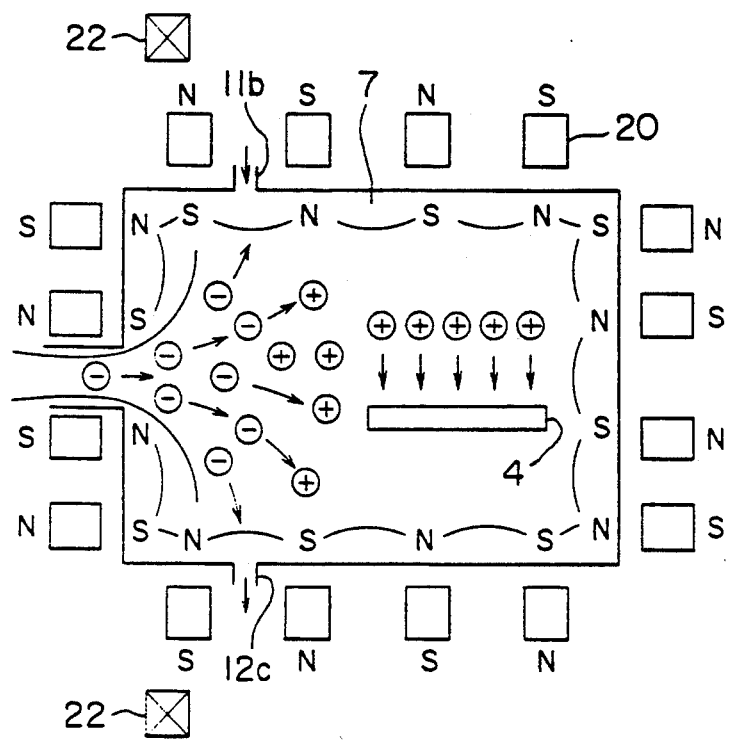
FIG. 13A and 13B are outline sectional views of examples of a material setting direction with respect to electron beam axis used in the electron beam excited ion irradiation apparatus of the present invention.
Figure 13B:
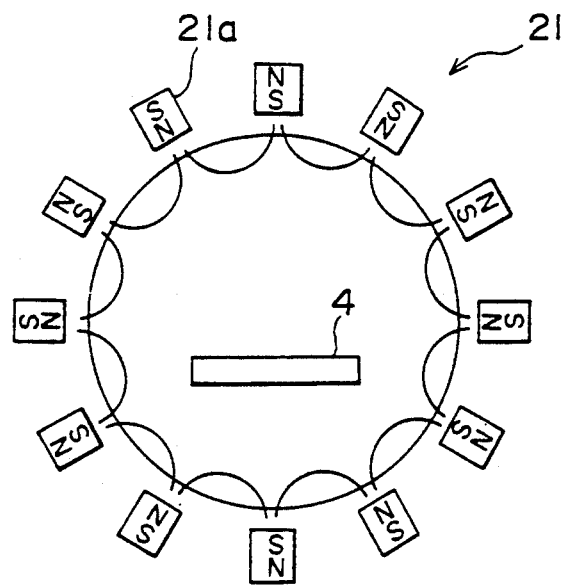

As shown in FIGS. 13A and 13B, when the material 18 is placed inside the ion generation chamber 7, the material setting member 4 is inclined and the surface of the material 18 is inclined with respect to the axis of injection of the electron beams so that it is possible to further reduce the ion energy when there is ion irradiation.

Normally, the inert gas such as argon gas or the like flows into the apparatus from the gas introduction opening 11a and 11b and is exhausted from the gas exhaust openings 12a, 12b and 12c. An active gas flows to the gas introduction opening 11b either by itself or along with an inert gas and control of the two flow amounts or the pressure in the ion generation chamber enables the amount of ions generated to be changed in accordance with necessity, and for the potential of the material 18 at floating potential on the material setting member 4 to be lowered. As a result, the irradiation energy of the ions irradiated to the material 18 is lowered, and the irradiated ions produce no large damage to the material 18.

Furthermore, the acceleration anode 3 can be divided into two, and the ion generation chamber 7 can be separated into an ion generation region and a material region.

Figure 14:
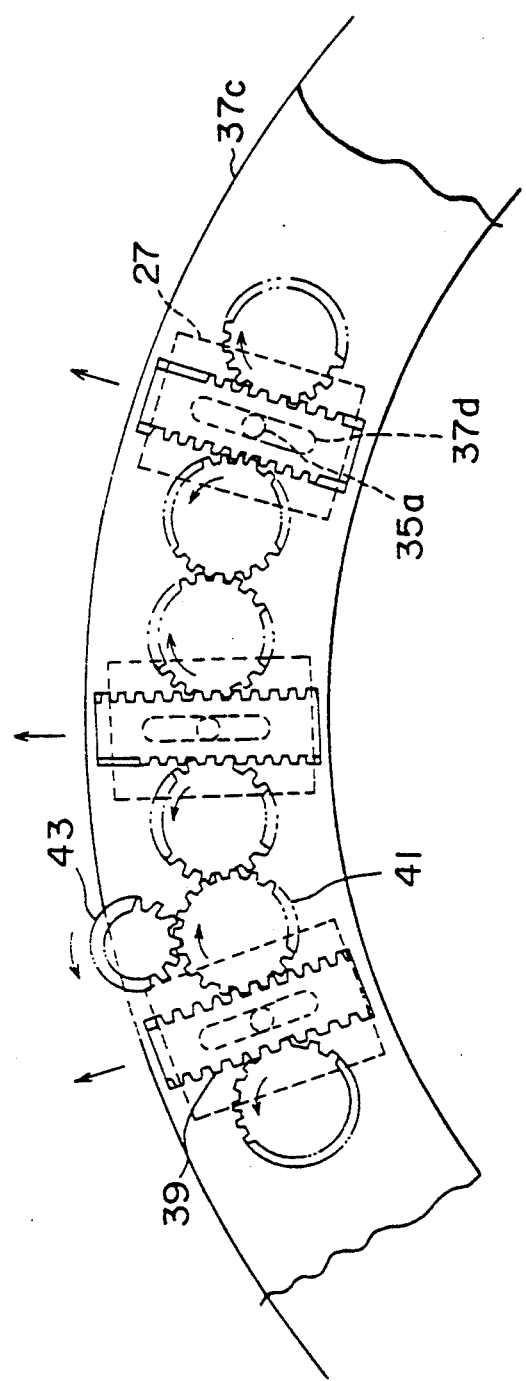
FIG. 14 is an outline sectional view showing the magnet movement mechanism used in the electron beam excitation ion irradiation apparatus of the present invention.

In the embodiment shown in FIG. 14, the plural number of permanent magnets 27 provided around the outer peripheral wall of the ion generation chamber 7 can move in the direction of the diameter of the ion generation chamber 7. When the ion irradiation apparatus of the present invention is used as an apparatus for the etching of a Si wafer, it is necessary to have occasional cleaning of the material which is accumulated on the inner wall of the ion generation chamber 7 when there is etching. This cleaning can be easily performed by moving the permanent magnets 27 in the direction of the diameter of the ion generation chamber 7.

In FIG. 14, a rotating shaft 35a provided to an end of each of the permanent magnets 27 passes through a slot portion 37d formed in a support frame 37c and united with a square rod 39 which has teeth cut into both sides. Both sides of the square rod 39 are provided transmission gears 41 which engage the square rod 39. The adjacent transmission gears 41 engage and a drive gear 43 engages with one of the transmission gears 41. Also in FIG. 14, the ion generation chamber 7 is not shown. This magnet moving mechanism shown in FIG. 14 is provided to both sides of each of the permanent magnets 27.

When the drive gear 43 rotates by a drive means not shown in the figure, each of the transmission gears 41 rotate in the directions shown by the arrows and move the angled rod 39 upwards, and so moves the permanent magnets 27 upwards.

In the present invention, $Cl_2$ is used as the etching gas. Silane gas or the like can be used as a film growth gas to generate Si Hn (n=1 to 3) radicals. The magnetic shutter uniformly generates Si Hn (n=1 to 3) radicals between the material setting member and the magnetic shutter and so it is possible to have amorphous Si film growth by Si Hn (n=1 to 3) radicals.

According to an electron beam excited ion irradiation apparatus of the present invention, control of the plasma density inside a plasma region enables control of the ion current (number of ions) irradiated.

Furthermore, according to an electron beam excited ion irradiation apparatus of the present invention, control of the voltage which is applied across the acceleration cathode and the acceleration anode enables ion having a large current density and which are uniform for across a wide area in the low ion energy region to be irradiated to a material.

Because of this, it is possible to control the electrons which directly hit the surface of a material such as a wafer or the like, with a large energy of motion so that there is low floating potential and no damage to the material.

As a result, the reliability of products such as integrated circuits is improved.

The arrangement of a magnetic shutter enables a similar effect to the above to be expected also for ion irradiation apparatus which use other plasma generation methods, and for the uniformity of ion current to be improved.

What is claimed is:

1. An electron beam excited ion irradiation apparatus comprising:
    a plasma filling chamber having a cathode and a first acceleration electrode, the first acceleration electrode acting as an anode with respect to the cathode when a first specific potential difference is applied between the first acceleration electrode and the cathode, the first specific potential difference changing an inert gas in the plasma filling chamber into a plasma;
    an electron beam acceleration chamber having a second acceleration electrode, the second acceleration electrode acting as an anode with respect to the first acceleration electrode when a second specific potential difference is applied between the second acceleration electrode and the first acceleration electrode, the second specific potential difference drawing a plurality of electrons from the plasma and forming an accelerated electron beam; and
    an ion generation chamber having a material setting member and a material, the material being positioned on a side of the material setting member facing the second acceleration electrode, the second acceleration electrode generating a plurality of ions when the accelerated electron beam passes through an active gas in the ion generation chamber, the plurality of ions directed towards the material,
    the ion generation chamber further having electron movement direction changing means for changing a direction of the electron beam to prevent injection of the material by the electron beam, the electron movement direction changing means positioned between the material and the second acceleration electrode.

2. The electron beam excited ion irradiation apparatus of claim 1, wherein the electron movement direction changing means includes a plurality of magnets arranged to form a ring, the plurality of magnets arranged symmetrically with respect to a center of the ring, the magnets generating a magnetic field, the magnetic field changing a direction of the electron beam.

3. The electron beam excited ion irradiation apparatus of claim 2, wherein each of the magnets is a permanent magnet.

4. The electron beam excited ion irradiation apparatus of claim 2, wherein each of the magnets is an electromagnet.

5. The electron beam excited ion irradiation apparatus of claim 2, further comprising preventing means for preventing the electron beam which is radiating vertically towards a surface of the material from passing through a hole in the ring formed by the plurality of magnets.

6. The electron beam excited ion irradiation apparatus of claim 1, wherein the electron movement direction changing means includes a plurality of fan-shaped permanent magnets arranged to form a ring, and a ring-shaped magnet housing member having a cavity, the cavity housing the plurality of fan-shaped permanent magnets, the plurality of fan-shaped permanent magnets generating a magnetic field, the magnetic field changing a direction of the electron beam radiating vertically towards a surface of the material.

7. The electron beam excited ion irradiation apparatus of claim 1, wherein the electron movement direction changing means includes a ring-shaped magnet, the ring-shaped magnet generating a magnetic field, the magnetic field changing a direction of the electron beam radiating vertically towards a surface of the material.

8. The electron beam excited ion irradiation apparatus of claim 7, further comprising preventing means for preventing the electron beam radiating vertically towards a surface of the material from passing through a hole in the ring-shaped magnet.

9. A method of electron beam excited ion irradiation comprising the steps of:
generating a discharge in an atmosphere of an inert gas to change the inert gas into a plasma;
applying a specific potential difference to a plurality of electrons included in the plasma, the specific potential difference changing the plurality of electrons into an accelerated electron beam;
generating a plurality of ions by passing the accelerated electron beam through an active gas;
directing the plurality of ions towards a material; and
changing a direction of the accelerated electron beam prior to irradiation of the material to change an electrical potential of the material and to prevent the accelerated electron beam from injecting the material, the accelerated electron beam radiating vertically towards a surface of the material.

10. The method of claim 9, wherein the ion generation step includes passing the electron beam through a mixed gas, the mixed gas comprising an inert gas and an active gas.

11. An electron beam excited ion irradiation apparatus comprising:
a plasma filling chamber having a cathode and a first acceleration electrode, the first acceleration electrode acting as an anode with respect to the cathode when a first specific potential difference is applied between the first acceleration electrode and the cathode, the first specific potential difference changing an inert gas in the plasma filling chamber into a plasma;
an electron beam acceleration chamber having a second acceleration electrode, the second acceleration electrode acting as an anode with respect to the first acceleration electrode when a second specific potential difference is applied between the second acceleration electrode and the first acceleration electrode, the second specific potential difference drawing electrons from the plasma and forming an accelerated electron beam;
an ion generation chamber having a material setting member and a material, the material positioned on a side of the material setting member facing the second acceleration electrode, the second acceleration electrode generating a plurality of ions when the accelerated electron beam passes through an active gas in the ion generation chamber, the plurality of ions directed towards the material;
the ion generation chamber having electron movement changing means for changing a direction of the electron beam and for changing an electric potential of the material to prevent injection of the material by the electron beam, the electron movement changing means positioned between the second acceleration electrode and the material;
the ion generation chamber having a plurality of magnets, the plurality of magnets surrounding the electron beam, the plurality of magnets forming a magnetic field, the magnetic field holding the electron beam inside the ion generation chamber.

12. The electron beam excited ion irradiation apparatus of claim 11, wherein each of the magnets has a triangular shape, a peak of each of the triangular shapes surrounding said electron beam, and forming a closed magnetic field in a vicinity of the plurality of magnets.

13. An electron beam excited ion irradiation apparatus comprising:
a plasma filling chamber having a cathode and a first acceleration electrode, the first acceleration electrode acting as an anode with respect to the cathode when a first specific potential difference is applied between the first acceleration electrode and the cathode, the first specific potential difference changing an inert gas in the plasma filling chamber into a plasma;
an electron beam acceleration chamber having a second acceleration electrode, the second acceleration electrode acting as an anode with respect to the first acceleration electrode when a second specific potential difference is applied between the second acceleration electrode and the first acceleration electrode, the second specific potential difference drawing electrons from the plasma and forming an accelerated electron beam;
an ion generation chamber having a material setting member and a material, the material being positioned on a side of the material setting member opposite the second acceleration electrode, the second acceleration electrode generating a plurality of ions when the accelerated electron beam passes through an active gas in the ion generation chamber, the plurality of ions directed towards the material,
the ion generation chamber having a plurality of magnets, the plurality of magnets surrounding the electron beam, the plurality of magnets forming a magnetic field, the magnetic field holding the electron beam inside the ion generation chamber, the ion generation chamber having a moving mechanism moving the plurality of magnets in a direction of a diameter of the ion generation chamber.

14. An electron beam excited ion irradiation apparatus comprising:
   a plasma filling chamber having a cathode and a first acceleration electrode, the first acceleration electrode acting as an anode with respect to the cathode when a first specific potential difference is applied between the first acceleration electrode and the cathode, the first specific potential difference changing an inert gas in the plasma filling chamber into a plasma;
   an electron beam acceleration chamber having a second acceleration electrode, the second acceleration electrode acting as an anode with respect to the first acceleration electrode when a second specific potential difference is applied between the second acceleration electrode and the first acceleration electrode, the second specific potential difference drawing electrons from the plasma and forming an accelerated electron beam;
   an ion generation chamber having a material setting members and a material, the material being positioned on a side of the material setting member opposite the second acceleration electrode, the second acceleration electrode generating a plurality of ions when the accelerated electron beam passes through an active gas in the ion generation chamber, the plurality of ions directed towards the material,
   the ion generation chamber having a plurality of magnets, the plurality of magnets surrounding the electron beam, the plurality of magnets forming a magnetic field, the magnetic field holding the electron beam inside the ion generation chamber,
   the ion generation chamber having an angle changing mechanism changing an angle of a magnetic pole of each of the plurality of magnets with respect to a direction of a diameter of the ion generation chamber to change the magnetic field formed by the plurality of magnets.

15. A method of electron beam excited ion irradiation comprising the steps of:
   generating a discharge in an atmosphere of an inert gas to change the inert gas into a plasma;
   applying a specific potential difference to a plurality of electrons included in the plasma, the specific potential difference changing the plurality of electrons into an accelerated electron beam;
   generating a plurality of ions by passing the accelerated electron beam through an active gas;
   directing the plurality of ions toward a material; and
   changing an electric potential of the material by inclining a surface of the material with respect to a direction of the electron beam. V

* * * * *